United States Patent [19]
Eklund

[11] Patent Number: 5,453,413
[45] Date of Patent: Sep. 26, 1995

[54] PHOTOTRANSFORMATION OF FULLERENES

[75] Inventor: Peter C. Eklund, Georgetown, Ky.

[73] Assignee: Nanotechnologies, Inc., Lexington, Ky.

[21] Appl. No.: 73,533

[22] Filed: Jun. 8, 1993

[51] Int. Cl.$^6$ ............................................. B01J 20/20
[52] U.S. Cl. .................. 502/416; 423/445 B; 252/186.1; 252/183.14
[58] Field of Search .................. 423/445 B, DIG. 39, 423/415.1; 252/186.1, 183.14; 502/416, 437

[56] References Cited

FOREIGN PATENT DOCUMENTS 94-22573  10/1994  WIPO ................................ 502/416

OTHER PUBLICATIONS

Reber et al., "Luminescence and Absorption Spectra of $C_{60}$ Films", J. Phys. Chem., 95(6), Mar. 21, 1991, pp. 2127–2129.
Taylor et al., "The Chemistry of Fullerenes," Nature, vol. 252, pp. 685–693, Jun. 24, 1993.
A. M. Rao et al., J. Mast. Res., vol. 8, No. 9, Sep. 1993 pp. 1–5.
Hawkins, et al., Crystal Structure of Osmylated $C_{60}$: Confirmation of the Soccer Ball Framework Department of Chemistry, Science, vol. 252 pp. 312–313.
Kroto et al. $C_{60}$ Buckminsterfullerene, Nov., 1985, School of Chemistry and Molecular Sciences, vol. 318, pp. 162–163.
Taylor, et al., Degradation of $C_{60}$ by light, May 1991, Nature, vol. 351 p. 277.
Arai et al., Resistivity of Single Crystal $C_{60}$ and Effect of Oxygen, 1992, no month available Solid State Communications, vol. 84, No. 8 pp. 827–829.
Vassallo, et al., J. Am. Chem., Soc. 1991, Emission FTIR Study of $C_{60}$ Thermal Stability and Oxidation, 1991 no month available American Chemical Society, vol. 113 pp. 7820–7821.
Hawkins, et al. 2D Nuclear Magnetic Resonance Analysis of Osmylated $C_{60}$, no month available 1991, J. Am. Chem, Soc., vol. 113, pp. 7770–7771.
Duclos et al., The Influence of Oxygen on the Raman Spectrum of $C_{60}$ Films, 1991, no month available Solid State Communications vol. 80, No. 7, pp. 481–484.
Kalsbeck et al., 1991, J. Electroanal. Chem. 314, pp. 363–370.
Kroll et al. Interaction of $O_2$ with $C_{60}$ photon–induced oxidation, Jun. 21, 1991, vol. 181, No. 2,3.
Assink, et al., Intercalculation of molecular species into the interstitial sites of fullerene, Aug. 1992, J. Master Res., vol. 7, No. 8 pp. 2136–2142.
Creegan, et al., Synthesis and Characterization of $C_{60}$, the First Fullerene Epoxide, 1992, no month available J. Am. Chem. Soc vol. 114, pp. 1103–1105.
Diederich, et al. The Higher Fullerness: Isolation and Characterization of $C_{76}$ $C_{84}$ $C_{90}$ and $C_{70}O$, an Oxide of $D_{5h}$–$C_{70}$, Apr. 1991, Science, vol. 252, pp. 548–551.
Taliani, et al., Light–Induced Oxygen Incision of $C_{60}$, 1993, J. Chem. Soc., Chem. Commun., pp. 221–222.
Nissen, et al., Highly Structured Singlet Oxygen Photoluminescence from Crystalline $C_{60}$, 1992 no month available, The American Instiute of Physics, pp. 2871–2873.
Fagan, et al. The Chemical Nature of Buckminsterfullerence ($C_{60}$) and the Characterization of a Platinum Derivative, 1990, no month available Science, pp. 1160–1161.
Selig et al., Fluorinated Fullerenes, 1991, no month available J. Am. Chem. Soc, vol. 113, pp. 5475–5476.
Fagan, et al. Metal Complexes of Buckminsterfullerene ($C_{60}$), 1992, no month available Acc. Chem. Res. vol. 25, 134–142.

Primary Examiner—Gary P. Straub
Assistant Examiner—Peter DiMauro
Attorney, Agent, or Firm—Fish & Richardson

[57] ABSTRACT

Compounds consisting of two or more fullerenes (e.g., a $C_{60}$ dimer) and a film or powder which includes covalently linked fullerene molecules. Also disclosed is a fullerene film or powder with gas molecules or atoms uniformly disposed therein, as well as a method of diffusing gas molecules or atoms into or through a film or powder made of pristine fullerene molecules.

10 Claims, 7 Drawing Sheets

PHOTOTRANSFORMATION OF FULLERENES

BACKGROUND OF THE INVENTION

This invention relates to phototransformation of fullerenes, i.e., photo-induced and photo-assisted reactions which involve fullerenes.

The discovery of stable fullerenes, or carbon cage molecules $C_n$ (n=60, 70, ... ) by Smalley, Kroto and coworkers has led to a new class of carbon-based solids with unusual properties. At room temperature, the molecules in solid $C_{60}$ are centered on lattice positions of a face centered cubic ("fcc") structure, and are observed in NMR experiments to be rapidly rotating about these lattice positions. This unusual behavior is consistent with the weak intermolecular van der Waals bonding and the nearly spherical character of the $C_{60}$ molecule. A polymerized $C_{60}$ network has recently been reported. In one study, the $C_{60}$ molecules were found to be linked together by a hydrocarbon bridge formed in the reaction of $C_{60}$ in solution (toluene) with di-radical xylylene. Photoconductivity experiments of mixtures of $C_{60}$ and polystyrene suggest that $C_{60}$ attaches to polystyrene polymer.

The reactivity of $C_{60}$ with oxygen has been known to occur in $O_2$-saturated benzene in the presence of ultraviolet light. The reaction of dioxygen ($O_2$) with solid $C_{60}$ was first noted in XPS studies of thin solid $C_{60}$ films sublimed onto GaAs substrates. In these experiments, photo-assisted reactions were observed which involved the surface formation of CO, $CO_2$, carbonyl groups and possibly amorphous carbon. The oxidation of $C_{60}$ in oxygen-saturated benzene to form epoxide was subsequently reported. Later, it was shown that a reaction of solid $C_{60}$ with dimethyldioxirane also leads to the formation of the $C_{60}$ epoxide and a $C_{60}$-1,3-dioxolane derivative. Thermal oxidation of $C_{60}$ powder in the presence of oxygen by infrared emission spectroscopy was also observed. Furthermore, it has also been demonstrated that a photo-induced reaction of $C_{60}$ with excited molecular oxygen $^1O_2$ leads to an incision in $C_{60}$ cage due to the formation of oxides. In the case of higher fullerenes such as $C_{70}$, it has been shown that a photochemical reaction of $C_{70}$ with oxygen leads to the formation of $C_{70}O$ with oxa-bridged annulene structure. Finally, an enhancement in the resistivity (by a factor of $10^4$) of pristine $C_{60}$ that was caused due to the thermal absorption of oxygen in single crystal $C_{60}$ was recently reported.

Based on the high resolution $^{13}C$ NMR spectrum of fcc $C_{60}$ exposed to 1 kbar oxygen for 1.75 h at room temperature, it was reported that the $O_2$ molecules occupy the octahedral interstitial sites of the fcc $C_{60}$ lattice, with 8% of the octahedral sites being occupied by $O_2$. Also, it was shown from the singlet oxygen photoluminescence spectrum of oxygen intercalated $C_{60}$ crystal that oxygen is present as $O_2$, rather than as atomic oxygen bonded to the $C_{60}$ molecules. In the presence of photo-excitation, $C_{60}$ is known to be 100% efficient in the generation of the highly reactive and unstable singlet ($^1O_2$) oxygen.

SUMMARY OF THE INVENTION

One aspect of the invention features a film or powder which contains covalently linked fullerene molecules. By "fullerene molecule" is meant a hollow carbon molecule consisting of hexagonal and pentagonal carbon rings or a compound derived from such a carbon molecule. A preferred fullerene molecule which can be used to prepare or practice the present invention (i.e., the above-described film or powder and otherwise) has the formula $C_n$ in which n is 60 or 70. The formula $C_n$ in this disclosure denotes the chemical structure of a fullerene molecule before it is covalently linked to another molecule (e.g., a second fullerene molecule) or an atom (e.g., oxygen). The term "covalently linked" as used in "covalently linked fullerene molecules" refers to linkage between at least two fullerene molecules in the film or powder described above, and covers, among others, the situation where only two fullerene molecules are linked together and the situation where all fullerene molecules are cross-linked to form polymeric fullerenes.

A related aspect of the invention is a method of preparing the above-described film or powder which contains covalently bonded fullerene molecules. The method includes the step of irradiating a film or powder made of pristine fullerene molecules with a light (wavelengths ~1 Å—7,000 Å; preferably, ~1,800 Å—6,000 Å, or even more preferably, ~3,000 Å—6,000 Å), an electron beam or an ion beam in a vacuum (i.e., $10^{-3}$ Torr or lower) or in an inert atmosphere (e.g., He 1 atm, $H_2O+O_2$<10 ppm) for a period of time sufficient to achieve the desired degree of intermolecular linkage formation. The term "pristine fullerene molecules" in this disclosure refers to fullerene molecules in a solid form, preferably of microcrystalline structure (e.g., fcc for pristine $C_{60}$ fullerenes). By "an inert atmosphere" is meant an atmosphere which is free of any gas which is reactive with the pristine fullerene film or powder upon irradiation with a light, an electron beam or an ion beam. It may be desirable to control the depth or area of linkage among fullerene molecules by adjusting the fluence of the light or by limiting the irradiation to a predetermined area(s).

In another related aspect, the invention features a compound consisting of two, three or four covalently linked fullerene molecules.

Also within the scope of the invention is a film or powder made of fullerene molecules with gas molecules or atoms uniformly disposed throughout the film or powder. Examples of a gas molecule or atom referred to in this disclosure (the just-described film or powder and otherwise) include, but are not limited to, $O_2$, $N_2$, $NH_3$, CO, $CO_2$, $CH_4$ or Ar. By "uniform" is meant that the difference between the concentrations of the gas molecules or atoms in any two local regions throughout the film or powder is less than 20%. Preferably, the difference is less than 10%. The gas molecules or atoms can be either physisorbed onto the fullerene molecules or covalently linked to the fullerene molecules (e.g., via formation of epoxides when the gas is $O_2$). Where molecular oxygen is physisorbed throughout the film or powder made of $C_{60}$, the stoichiometry of $C_{60}$ and $O_2$ preferably is $C_{60}(O_2)_x$ in which x is 0.3–2. It is particularly preferred that x be 0.7–2 or 0.3–1, with the most preferred range being 0.7–1.

A further aspect of the invention relates to a method of diffusing gas molecules or atoms into or through a film or powder made of pristine fullerene molecules. The method includes the step of irradiating the pristine fullerene film or powder with a light, an electron beam or an ion beam in a vacuum (i.e., $10^{-3}$ Torr or lower) in the presence of the gas molecules or atoms of interest (e.g., $10^{-4}$ atm to $10^4$ atm; preferably, $10^{-1}$ atm to 10 atm) for a period of time sufficient to achieve the desired degree of gas diffusion or passage. An example of a gas which can be used to practice this method is $O_2$. The wavelengths of the lights which can be used to assist diffusion or passage of gas molecules or atoms range from ~1 Å to ~7,000 Å; or more preferably, from ~1,800 Å to ~6,000 Å. The most preferred range is λ3,000 Å–λ6,000 Å). If desired, one can control the degree of gas diffusion or passage by adjusting the fluence of the irradiating light. Similarly, irradiation can be performed only on a selected area(s) of a fullerene film.

Other features and advantages of the present invention will be apparent from the following drawings and description of the preferred embodiments, and also from the appending claims.

BRIEF DESCRIPTION OF THE DRAWINGS

The drawings are first described.

DESCRIPTION OF THE PREFERRED EMBODIMENTS

Figure 1:
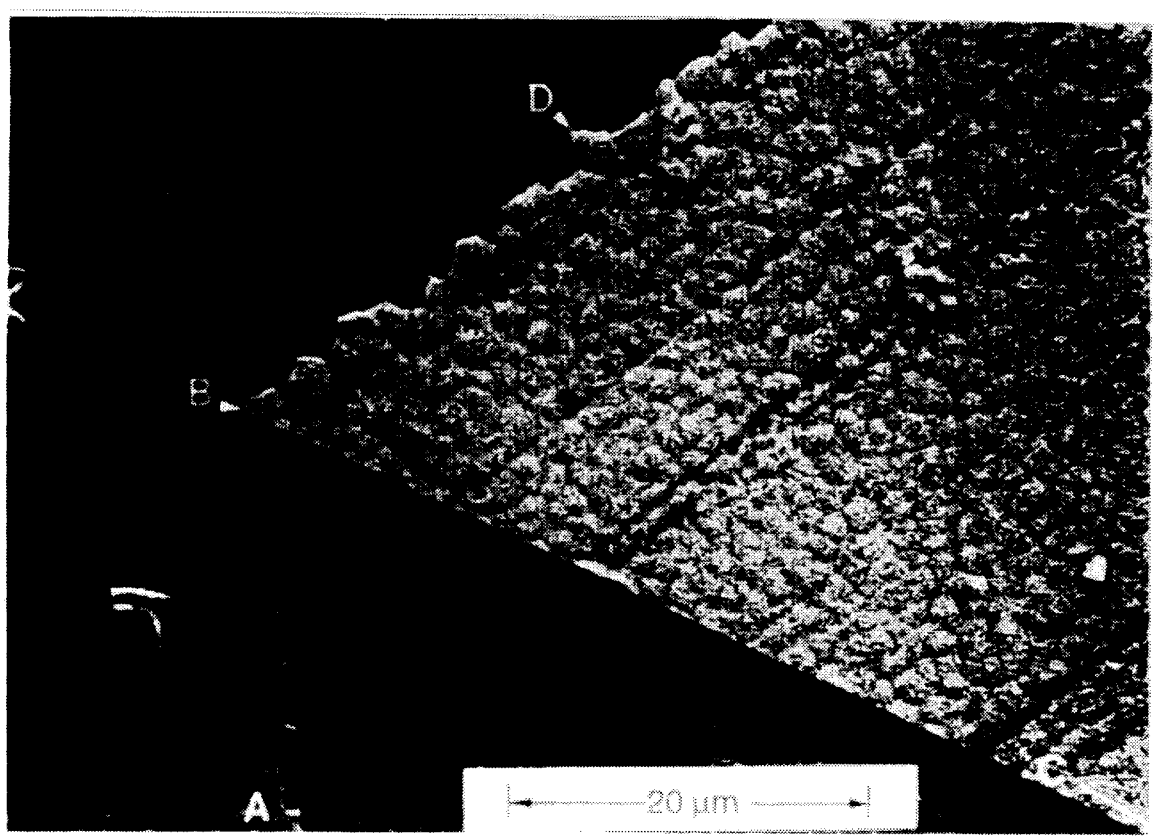
FIG. 1 is a scanning electron microscope image of phototransformed $C_{60}$ which has been exposed to boiling isodurene for ~1 min.

Irradiation of a fcc $C_{60}$ film or powder with light in a vacuum or in an inert atmosphere (e.g., He or Ar) leads to the dimerization of adjacent $C_{60}$ molecules in the solid phase. This process then eventually leads to the photopolymerization of the lattice. The temperature range for the efficient production of the dimers is ~250° K.<T<~373° K. Below ~250° K. the molecular orientation is improper for formation of covalent bonding between two adjacent $C_{60}$ molecules. Above ~373° K., the dimers or polymers (and all other forms in between) start to thermally decompose back to $C_{60}$ monomers. Oxygen, which quenches the luminescence of the first excited triplet state of $C_{60}$, should be substantially removed to a level such that the total amount of oxygen is very low, e.g., less than 10 ppm of $O_2$ and $H_2O$, in the photo-induced polymerization reaction chamber.

On the other hand, application of light to a pristine $C_{60}$ film or powder in the presence of oxygen (either $O_2$ in air or pure oxygen) enhances by 10 to 20 times the diffusion rate of oxygen into the interstitial positions in the bulk of the $C_{60}$. Vibrational and optical absorption spectroscopy indicates that the photo-assisted reaction of $O_2$ with pristine $C_{60}$ involves two coupled reactions: (i) the photo-assisted diffusion of molecular oxygen into pristine $C_{60}$, or physisorption, and (ii) oxidation of $C_{60}$. The temperature must be maintained above ~250° K. and preferably, below ~473° K. The solubility (e.g., in toluene) of $O_2$-containing pristine $C_{60}$ thus obtained decreases considerably, as compared with pristine $C_{60}$. With light and in a vacuum, the reaction is reversible to a large extent, i.e., most of the physisorbed dioxygen molecules can be removed from the film or powder.

For both photo-induced polymerization of pristine $C_{60}$ and photo-assisted $O_2$ diffusion/oxidation (i.e., oxygen doping) into pristine $C_{60}$, the light applied may be either in the visible/UV range (i.e., energy larger than the bandgap of $C_{60}$) or otherwise. Also, for a more complete reaction, it is preferred that the thickness of the film or powder be no greater than the optical skin depth (or optical penetration depth) of the applied light. The optical skin depth of a light is a function of the wavelength of that light. Thus, for a visible light with a wavelength of ~5,000 Å, the optical skin depth is about 8,000 Å.

A pristine $C_{60}$ film of a desired optical skin depth suitable for polymerization or oxygen doping can be vacuum deposited on a proper substrate. By "a proper substrate" is meant a substrate which does not interfere with the above-described photoreactions. Proper substrates include, but are not limited to, amorphous insulators (e.g., glass), covalent insulators (e.g., silicon), ionic insulators (e.g., KBr), and metallic conductors (e.g., copper or stainless steel). Alternatively, a free standing film can also be used, particularly in the situation where $O_2$ is to be passed through a fullerene membrane. For preparation of a free-standing $C_{60}$ film, see, e.g., C.B. Eom et al. Science 259: 1887 (1993), which is hereby incorporated by reference. On the other hand, a $C_{60}$ powder of a desired optical skin depth can be obtained by ball-milling or grinding microcrystalline $C_{60}$ (e.g., 1–50 μm dia.). While a film is irradiated with a light either on a substrate or free-standing, irradiation of a pristine $C_{60}$ powder can be performed in a rotating drum.

The fluence of the light to be used in $C_{60}$ photopolymerization varies, among others, with the irradiation time and the desired degree of fullerene polymerization. As a general rule, dimer formation requires the absorption of one photon in photo-induced polymerization of $C_{60}$ and a preferred range of fluences is ~1 $mW/mm^2$ to ~1,000 $mW/mm^2$. A similar range of fluences can also be used for photo-assisted oxygen doping.

$C_{60}$ dimer can be prepared by irradiating a $C_{60}$ powder with a light to effect dimerization (as well as higher degrees of polymerization), dissolving the dimer and other soluble products thus formed in the powder into a suitable solvent (e.g., toluene), and finally purifying the dimer using methods such as chromatography. If necessary, a polymeric $C_{60}$ powder can be heated between 100° C.–170° C. to decompose some of the $C_{60}$ polymer back to dimer before the dissolution and purification steps. $C_{60}$ trimer or tetramer can be prepared in an analogous manner. These dimeric, trimeric or tetrameric compounds can be used as intermediates for preparation of $C_{60}$-based molecules. Similarly, $C_{60}$-oxygen compounds purified from an oxidized $C_{60}$ powder as prepared by the above-described photo-assisted reaction can also serve as gateways to other $C_{60}$ adducts or polymers.

A polymeric $C_{60}$ film can be used as a photoresist, which, if desired, may be patterned by the application of light to selected areas of a pristine $C_{60}$ film. The irradiated areas are converted into insoluble polymeric $C_{60}$, whereas the unexposed areas dissolve readily in toluene or other suitable solvents. The pattern has the attractive property that it can be removed easily by heating to 100°–170° C. at which the polymer thermally decomposes back to $C_{60}$ monomers, and then dissolving in a proper solvent (e.g., toluene).

Polymeric $C_{60}$ can also be used as a pure carbon electrical insulator or as a substrate for trace element detection.

Solid $C_{60}$ (preferably as powder) with molecular oxygen physisorbed in it can be used a source of $O_2$. The physisorbed oxygen is releasable upon irradiation with a proper light. On the other hand, a $C_{60}$ film containing oxygen (either physisorbed or chemisorbed) can be used as a photoresist. Like polymeric $C_{60}$ films, oxygen-doped films can also be patterned by irradiating light only to selected areas. Those areas are then transformed to a low solubility state, whereas the unirradiated areas dissolve readily in a proper solvent. For films containing physisorbed $O_2$, the pattern can be removed in two steps: irradiating the pattern with a proper light in a vacuum (which results in desorption of $O_2$), and dissolving the irradiated pattern (solid $C_{60}$) in toluene or other suitable solvents.

Based on the photo-assisted diffusion of $O_2$ into pristine $C_{60}$, one can use a free-standing pristine $C_{60}$ film as a selective gas-permeable membrane. E.g., see M. R. Anderson et al. Science 252:1412 (1991), which is hereby incorporated by reference.

Without further elaboration, it is believed that one skilled in the art can, based on the description herein, utilize the present invention to its fullest extent. The following specific embodiments are, therefore, to be construed as merely illustrative, and not limitative of the remainder of the disclosure in any way whatsoever. Also note that all of the articles cited hereinafter are incorporated by reference.

Photo-Induced Polymerization of $C_{60}$ Films

Described below are experimental results which show that the application of visible or ultraviolet light to pristine $C_{60}$ polymerizes the structure, linking the molecules together in a covalently bonded fcc structure. After the photopolymerization, the film is no longer soluble in toluene, but can be dissolved in boiling isodurene.

The data presented here were taken on vacuum deposited thin pristine films of $C_{60}$ on either KBr, fused quartz, Si(100) or stainless steel substrates from 99% pure $C_{60}$ (Bluegrass Fullerenes, Inc.) first degassed in a vacuum of $10^{-5}$ Torr for 3 to 6 hours at T=300° C. For the laser desorption mass spectroscopy ("LDMS") studies, the $C_{60}$ film samples were deposited directly onto the end of stainless steel rods which could be transferred under a $N_2$ atmosphere into the mass spectrometer. The film deposition apparatus resides in a He-atmosphere glove box (Vacuum Atmospheres, Inc., $O_2$, $H_2O$<1 ppm), and the exposure of the films to oxygen can therefore be minimized. Inside the glovebox, the film/substrate samples were transferred to a gas tight cell with a quartz window which allowed the samples to be removed from the glove box and phototransformed by light from a 300 Watt Hg arc lamp or Ar ion laser. All the phototransformed $C_{60}$ films studied here received enough photon irradiation to downshift the PP mode frequency to 1460 $cm^{-1}$, and no trace of the 1469 $cm^{-1}$ pristine peak remained. Typical film thickness was in the range 1000<d <5000 Å.

A scanning electron microscope ("SEM") image was taken of a phototransformed film which had been first placed in boiling isodurene for several minutes (b.p. 198° C.). See FIG. 1. The film had broken loose from the substrate, tearing along the line AB, and folding over itself along line BC. That is, point A was folded to point D. The area ABC is associated with a residual phototransformed $C_{60}$ film still attached to the substrate. Striations in the $C_{60}$ film evident in the image are not transferred from the glass substrate. The cracks in the film were also not transferred from the substrate and are not evident in the pristine film. They may be the result of a simple heating process during irradiation, or the result of a small contraction in the lattice parameter. Films such as the one shown in the figure were observed to survive boiling toluene (b.p. 111° C.) for several hours, in contrast to pristine films which dissolve completely in seconds in stirred toluene at room temperature. However, it did eventually dissolve in boiling isodurene.

Figure 2A:
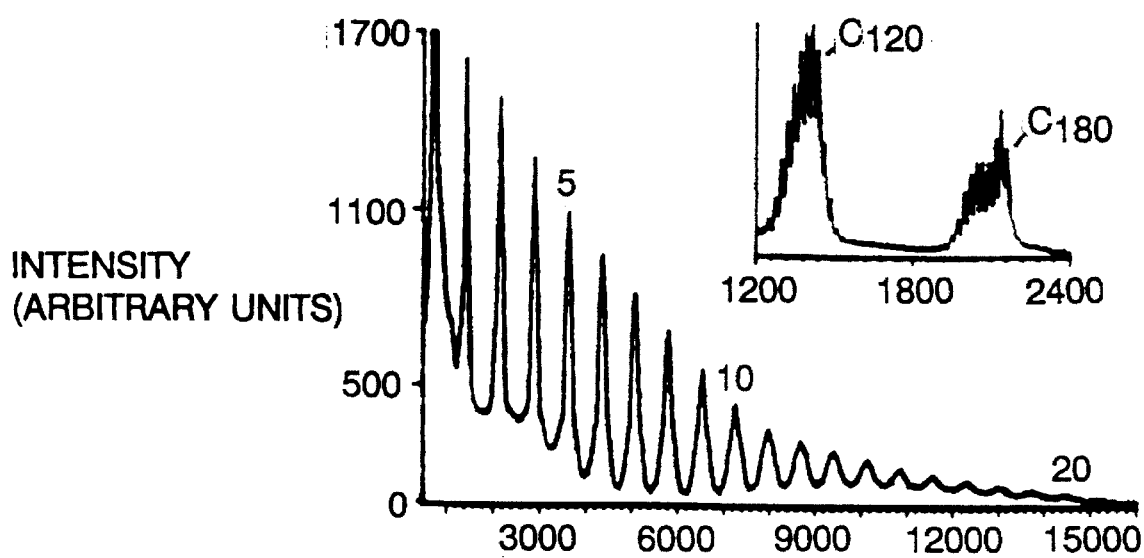
FIG. 2A is a laser desorption mass spectrum of a $C_{60}$ film (~2000 Å) phototransformed with UV-vis radiation from a 300 W Hg arc lamp for 12 hr. Insert to FIG. 2A is a LDMS spectrum shown on an expanded scale in the region of the dimer ($C_{120}$) and trimer ($C_{180}$) showing $C_2$ loss/gain in the desorption process.
Figure 2B:
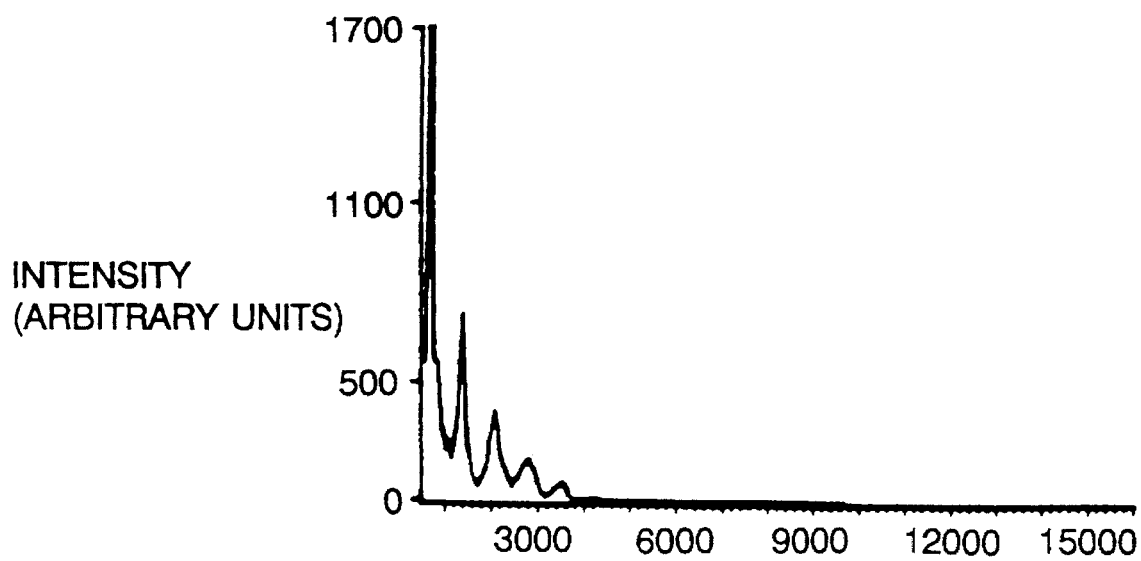
FIG. 2B is a laser desorption mass spectrum of a $C_{60}$ film not previously exposed to light. The data were taken under similar conditions to those shown in FIG. 2A.

LDMS spectra were collected on a phototransformed film (FIG. 2A, d=2000 Å, 12 hr exposure to radiation from a 300 W Hg arc lamp) and a pristine $C_{60}$ film (FIG. 2B, d=2000 Å) over the mass range encompassing $C_{60}$ (720 atomic mass units or amu) up to $21 \times C_{60}$ (15120 amu). The spectra in FIGS. 2A and 2B were taken using similar desorption conditions: $\sim 10^{-7}$ Torr vacuum, pulsed $N_2$ laser at 337 nm focused to a spot size of 0.3 mm dia., 5 to 10 ns pulse width, pulse energy 10 $mJ/cm^2$ and 10 Hz pulse repetition rate. In the inset to FIG. 2A, the data in the vicinity of $C_{120}$ (dimer) and $C_{180}$ (trimer) are displayed on an expanded scale, and the $C_2$ structure is clearly evident. As a result of the laser ablation of the phototransformed film, a succession of 20 clear peaks is evident in the mass spectrum of FIG. 2A, which were identified with clusters of cross-linked fullerene molecules $(C_{60})_N$. In FIG. 2B, the LDMS spectrum of a pristine film is seen to exhibit a series of peaks out to N=5. This suggests that at high laser power, the $N_2$ desorption laser itself is capable of producing polymerized $C_{60}$. At a reduced laser power, an LDMS spectrum on the phototransformed film similar to FIG. 2A was obtained, but this time terminating at N=8 to 10. For comparison to this latter result, the pristine film under these desorption conditions exhibited only the N=1 peak in its LDMS spectrum.

Figure 3A:
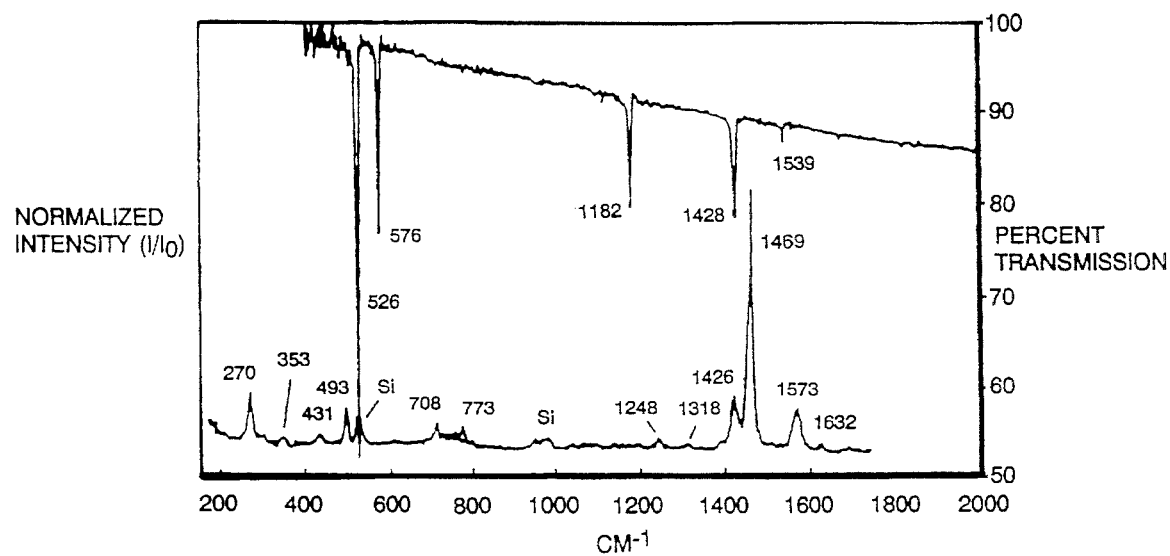
FIG. 3A is Raman scattering and Fourier transform infrared (FTIR) transmission spectra of pristine $C_{60}$.
Figure 3B:
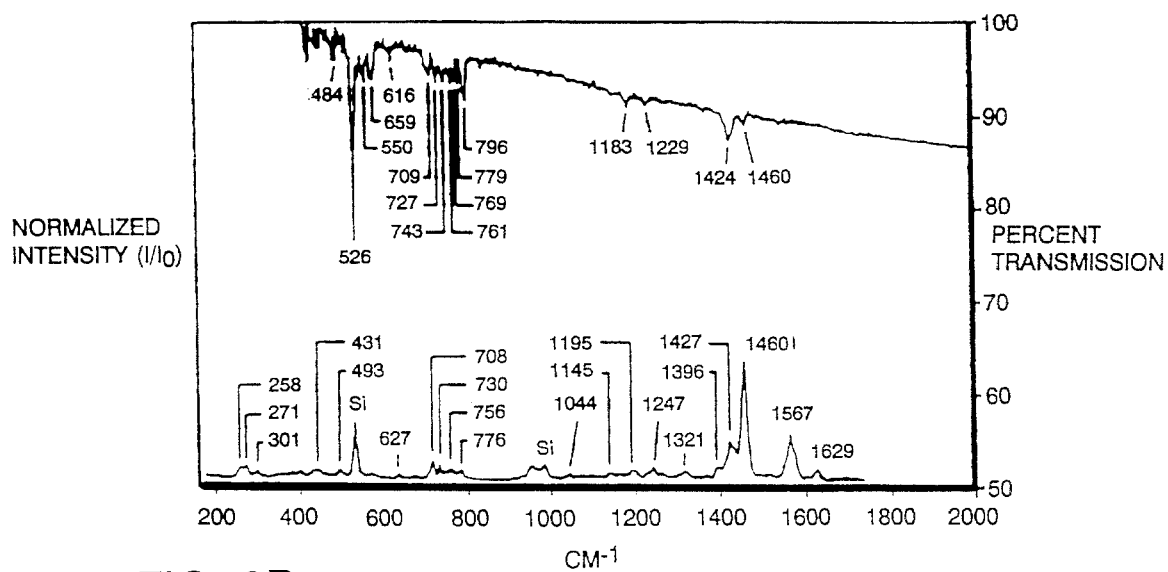
FIG. 3B is Raman scattering and FTIR transmission spectra of phototransformed $C_{60}$.

FIGS. 3A and 3B are results from the experiments which studied the effect of the photo-induced polymerization on the vibrational modes of solid $C_{60}$. Room temperature infrared ("IR") transmission and Raman spectra for pristine $C_{60}$ (FIG. 3A) and phototransformed $C_{60}$ (FIG. 3B) films are shown. The Raman spectra were taken at low laser power density (<50 $mW/mm^2$) using the 488 nm Ar ion line on samples deposited on Si(100) substrates. FTIR samples for spectra were deposited on KBr substrates. The IR and Raman data for pristine $C_{60}$ films are in good agreement with the results obtained by other researchers. The pristine spectra exhibit primarily intramolecular modes, that is, ten Raman-active (2 Ag+8 Hg) and four IR-active ($F_{1u}$) modes, consistent with a weak intermolecular interaction and the icosahedral symmetry of an isolated molecule. In contrast to these spectra of the pristine fcc phase, the Raman and IR spectra of the phototransformed phase exhibit many more lines, indicating that the icosahedral symmetry of the $C_{60}$ molecule has been lowered, consistent with the proposed photopolymerization process. These observations can be compared to contrasting Raman scattering results from $M_6C_{60}$ where M=K, Rb and Cs, and those from $C_{60}$ modified by the attachment of metal complexes, such as {((C$_6$H$_5$)$_3$P)$_2$M'}$_n$C$_{60}$, where M'=Ni, Pt, Pd. M$_6$C$_{60}$ is an ionically bonded insulator whose Raman spectrum is quite similar to that of solid C$_{60}$. Only a few new modes are activated by the ionic M-C$_{60}$ bonds, and most of the Raman-active modes in M$_6$C$_{60}$ can be identified as frequency-shifted modes of pristine C$_{60}$. In the metal-C$_{60}$ complexes, such as {((C$_6$H$_5$)$_3$P)$_2$Pt}$_n$C$_{60}$, a covalent bond forms between the n metal complexes and the C$_{60}$ ball, which appears to be very effective in activating additional Raman lines associated with the fullerene cage. The vibrational spectra shown in FIGS. 3A and 3B for the phototransformed phase therefore provide further evidence that the fullerenes have been linked together by carbon bonds. Further Raman scattering studies of C$_{60}$ in the range 30 to 200 cm$^{-1}$ (results not shown) indicate clearly that phototransformation introduces a new mode at $\omega$~116 cm$^{-1}$, which is identified with an inter-molecular vibrational mode.

Optical absorption spectra were collected on pristine and phototransformed C$_{60}$ films in the range 0.5 to 5.5 eV (data not shown). The effect of the phototransformation on the absorption spectrum is observed to be a broadening of the electronic absorption bands of C$_{60}$ about approximately the same band positions, indicating that the molecular structure of the monomers is closely related to that of C$_{60}$. Furthermore, T=300° K. luminescence spectra of pristine and phototransformed C$_{60}$ films obtained using 488 nm excitation are also quite similar. The strongest peak at ~725 nm in pristine C$_{60}$ is observed to redshift ~20 nm upon phototransformation. The small changes in these electronic spectra are consistent with a polymerization of fullerene molecules.

Moreover, the photo-induced polymerization of solid C$_{60}$ altered the x-ray diffraction of the films. Using Cu(K$_\alpha$) x-rays, three clear peaks in ~5000 Å thick pristine films which could be indexed according to the fcc lattice: (111), (220) and (311) were observed. Polymerization was found to broaden these peaks by ~20%, indicating an increase in disorder in the film, and the peaks were observed to shift slightly to higher scattering angles, consistent with an average contraction in the lattice constant of ~0.1 Å.

Described below are more Raman scattering studies on the photopolymerizability of solid C$_{60}$ and results from these studies.

Figure 4:
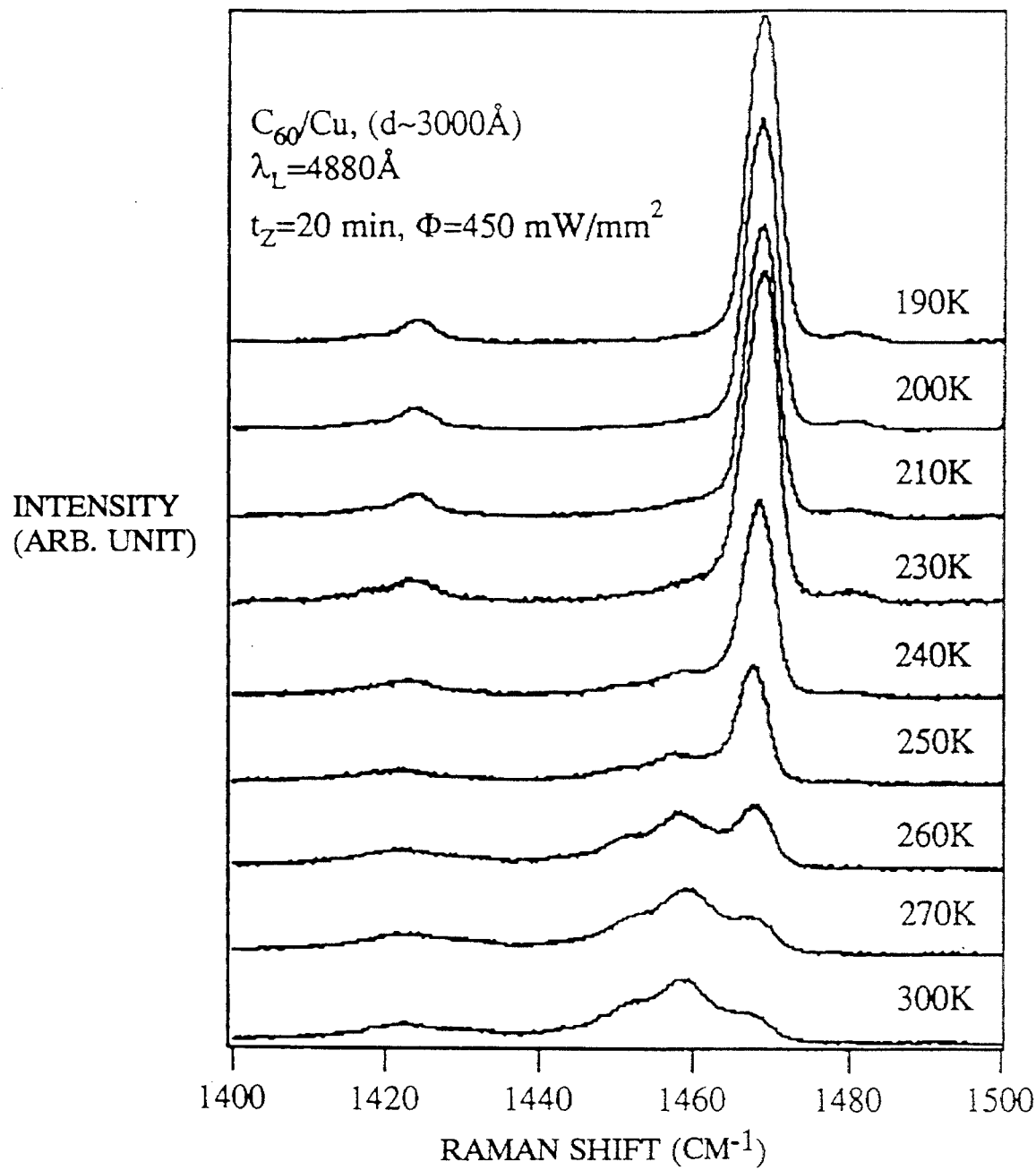
FIG. 4 is Raman spectra of a $C_{60}$ film (d~3000 Å) on a Cu substrate as a function of temperature (T) collected after 20 min pre-exposure to laser irradiation.

Thin solid films of C$_{60}$ were vacuum sublimed (~10-7 Torr) onto polished copper (Cu) substrates (1 cm dia.× 2 mm) which were anchored thermally to the cold finger of a closed cycle He refrigerator. After deposition, the films were exposed only to the He atmosphere in a glove box (H$_2$O, O$_2$<1 ppm) where the vacuum evaporator resides. The substrate temperature was monitored with a Au/Fe vs. Cu thermocouple attached to the back of the Cu substrate. The front surface of the C$_{60}$ film was in contact with a He exchange gas to reduce the possibility of laser heating effects and to avoid contact of the sample with oxygen. Displayed in FIG. 4 is a panel of Raman spectra collected at various temperatures using a fixed grating angle, a cooled, charge-coupled-array-detector, and 488 nm radiation from an Argon ion laser. The Raman laser also served as the source to promote the phototransformation of the C$_{60}$ film. Each spectrum in FIG. 4 was collected in a time $t_{scan}$=10 s after $t_z$=20 minutes pre-exposure of the C$_{60}$ film (d ~3000 Å) to a laser fluence $\phi$~450 mW/mm$^2$. A fresh spot on the sample was chosen for each spectrum taken at 9 different temperatures (T) between 190° K. and 300° K. All the spectra in FIG. 4 are normalized to one another using the area under the 1469 cm$^{-1}$ peak observed during the first 10 sec of exposure to the laser. For T≤250° K., the existence of a dominant 1469 cm$^{-1}$ peak, indicative of pristine C$_{60}$, is observed despite the 20 min pre-exposure to high laser fluence. Little or no evidence for phototransformation is detected, i.e., the unpolarized, photoinduced ~1458 cm$^{-1}$ mode is weak, indicating the film is effectively resisting photopolymerization in this temperature range. With increasing T above 250K, the film photopolymerizes more rapidly, evidenced by the rapid growth of the 1458 cm$^{-1}$ Raman structure[24]. To best show the temperature threshold for photopolymerizability of the solid C$_{60}$ lattice, in FIG. 5 the ratio of the integrated intensities $\mathfrak{R}$=I$_{1458}$/I$_{1469}$ is plotted as a function of T. To also show the effect of total irradiation dosage on the threshold, three curves corresponding to 10, 20 and 30 min pre-exposure to $\phi$ ~450 mW/mm$^2$ at 488 nm are plotted. The threshold for the photopolymerization near 250° K.~T$_o$ is clearly evident in FIG. 5.

Figure 5:
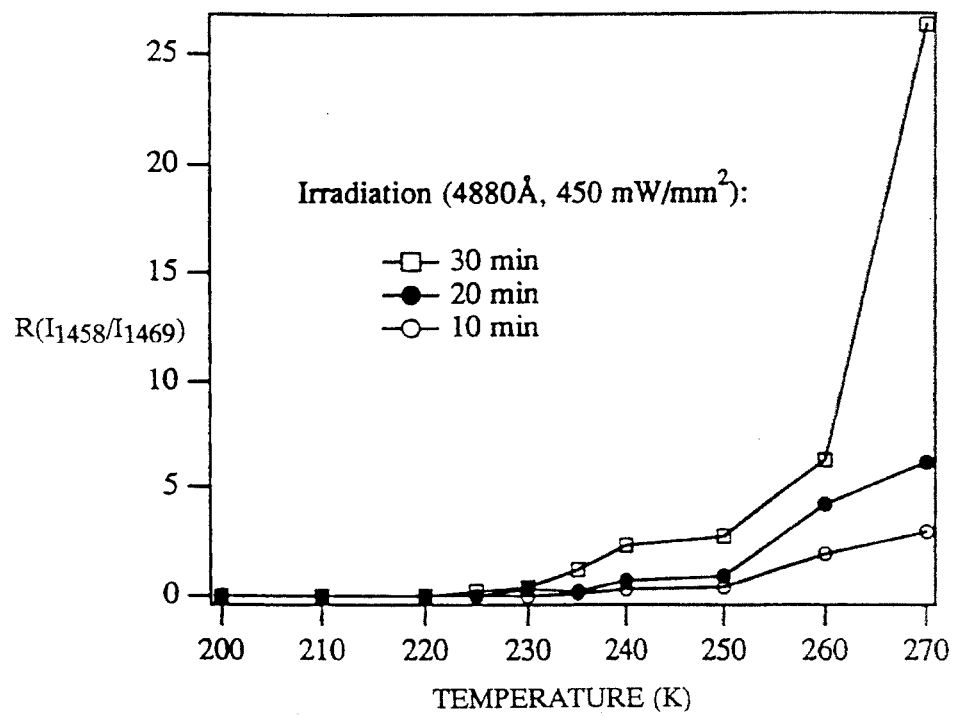
FIG. 5 is a graph based on the Raman spectra of FIG. 4 showing the ratio $\Re = I_{1458}/I_{1469}$ of the integrated intensity of the unpolarized 1458 $cm^{-1}$ line in phototransformed $C_{60}$ to that of the polarized 1469 $cm^{-1}$ "pentagonal pinch" mode of pristine $C_{60}$ as a function of temperature.

Briefly, the results shown in FIGS. 4 and 5 show clearly that a temperature threshold for the photo-polymerizability occurs near the orientational ordering transition temperature (T$_o$~260° K.) of solid C$_{60}$. Above T$_o$, the nearly spherical C$_{60}$ molecules are free to spin about randomly oriented axes centered on fcc lattice positions, and all relative orientations of the C$_{60}$ molecules are possible. In particular, it is possible to achieve the parallel alignment between reactive carbon double bonds on adjacent molecules. It appears that this topochemical condition, in conjunction with a nearly 100% efficient intersystem crossing and long-lived triplet state T$_1$, promotes covalent bonding between C$_{60}$ molecules via the well known "2+2 cycloaddition" reaction."

Many experiments on pristine C$_{60}$ have been carried out to study the nature of the orientational ordering transition of solid C$_{60}$. The data have been interpreted to indicate that (1) for T>T$_0$, the C$_{60}$ molecules spin freely about randomly oriented axes on fcc lattice positions, and (2) for T<T$_0$, two of the three rotational degrees of freedom in the high T phase are lost, and the molecules undergo a "ratchet-like" orientational hopping about four specific (111) directions as determined by x-ray and neutron studies. At T=90° K., a second transition to a merohedrally disordered glass phase ("MDGP") occurs, as first proposed by W. I. F. David et al. to explain neutron scattering results [Europhys. Lett. 18:219 (1992)]], and later used by P. Heiney et al. to fit x-ray diffraction data [J. Phys. Chem. Solids 53:1333 (1992)]. Both neutron and x-ray diffraction analyses in a MDGP model lead to an estimate of the number of molecules oriented such that an electron-rich double bond on one molecule faces the electron-deficient opening in a pentagon (~83%) or hexagon (~17%) of the adjacent molecule.

"2+2 cycloaddition" is a well known photochemical reaction resulting in the covalent attachment of two otherwise van der Waals bonded molecules. This mechanism is active in molecular solids when two carbon double bonds on adjacent molecules are oriented parallel to one another and separated by less than ~4.2 Å. By photochemical assistance, an excited molecular state is formed, and as a result both these double bonds are broken and reform as a four sided ring. Two C$_{60}$ molecules might dimerize by the "2+2 cycloaddition" mechanism. Since a C$_{60}$ molecule contains 30 reactive double bonds tangential to the ball surface, and these double bonds on adjacent molecules can be separated by as little as 3.5 Å in pristine solid C$_{60}$, then solid C$_{60}$ can be seen to satisfy the general topochemical requirement for "2+2 cycloaddition" in a constrained medium, but only for T >T$_0$. At low T, the double bonds on adjacent molecules avoid each other, and according to the topochemical requirement, the reaction should be suppressed. For T>T$_0$, however, the freely spinning molecules enjoy 30(30)=900 favorable orientations to promote the "2+2 cycloaddition" reaction, and one would expect the ratio $\mathcal{R}=I_{1458}/I_{1469}$ to exhibit a threshold near $T_0$, as observed here. Furthermore, as the temperature is increased, the frequency at which these favorable alignments occur increases, and the reaction rate per incident photon should increase, consistent with the data in FIG. 5.

The photophysics of $C_{60}$ also seems to favor the proposed reaction mechanism. First, strong, dipole-allowed, singlet-singlet absorption is observed above ~2.3 eV; second, a ~100% efficient intersystem crossing is needed to populate significantly the first excited triplet state ($T_1$); and third, a sufficiently long $T_1$ lifetime (~40 μsec) is needed to maintain a significant number of molecules in the reactive triplet state.

Another experimental result consistent with the importance of the $T_1$ state in the dimerization pathway is the observation that intercalated dioxygen "hardens" $C_{60}$ against phototransformation. That is, high laser fluence was not observed to produce phototransformation when dioxygen was present in the lattice. See, e.g., P. C. Eklund, et al. J. Phys. Chem. Solids 53:1391 (1992). It is suggested that the stabilizing influence of oxygen may be connected with the reported quenching of the $C_{60}(T_1)$ state via an interaction with the $(O_2)^3\Sigma$ state, thereby suppressing photopolymerization.

Photo-Assisted Oxygen Doping of $C_{60}$ Films

Fullerene molecules were generated in a carbon soot by an electric arc method [R. E. Haufler et al. J. Phys. Chem. 94:8634 (1990)], and $C_{60}$ was first separated from higher fullerenes in toluene using high performance liquid chromatography ("HPLC") with a gel-permeation column [M. S. Meier et al. J. Org. Chem. 57:1925 (1991)]. Toluene was subsequently evaporated (T≈30° C.) using a liquid nitrogen-trapped mechanical pump to obtain the $C_{60}$ powder which was then degassed at 300° C. for 6 h in $10^{-5}$ Torr vacuum and transferred into a He glove box (<1 ppm of $O_2$, $H_2O$). The glove box also houses a turbo-pumped, thin film deposition chamber for preparation of $C_{60}$ films. Oxygen-free $C_{60}$ films (d ~1000–5000 Å) were obtained by subliming microcrystalline $C_{60}$ onto quartz (Suprasil), KBr or Au-overcoated graphite substrates in vacuum (~1×10$^{-7}$ Torr). The films deposited on quartz and KBr substrates were used for optical measurements while the films grown on latter substrates were used in the α-particle backscattering experiments.

After film deposition, the $C_{60}$:quartz films were transferred from the deposition chamber, within the glove box, to a rectangular quartz tube equipped with a vacuum valve to allow the subsequent replacement of He with $O_2$. Oxygen-free $C_{60}$ films were subsequently doped with oxygen at 1 atm. and T=300° K. while being exposed either to unfiltered light from a 75 W Xe lamp or to monochromatic light from an Argon ion laser. Raman scattering and optical absorption data were collected with the $C_{60}$:quartz samples in these tubes. Resonant α-particle backscattering experiments were performed at the University of Kentucky 7.0 MV Van de Graaff accelerator to determine the oxygen doping profile. The $^{16}O(\alpha,\alpha_o)^{16}O$ reaction resonance at 3.04 MeV was used to determine the oxygen concentration profiles in the films. Room temperature Fourier Transform Infrared ("FTIR") transmission spectra were obtained by quickly (~1 min.) transferring the $C_{60}O_x$:KBr samples under flowing nitrogen gas into a $N_2$ purged, modified Digilab FTS 80 spectrometer.

The oxygen depth-profiling results obtained from the resonant α-particle backscattering experiments will be discussed first. It was found that $C_{60}$ films (d ~2400 Å) exposed simultaneously to light (Xe lamp, 0.4 mW/mm$^2$) and oxygen for 1 h exhibited a uniform distribution of oxygen throughout the entire film to a final stoichiometry of $C_{60}(O_2)_{0.8}$. On the other hand, samples exposed to oxygen for 1 h in the absence of light were found to exhibit only a surface oxide (~200 Å depth) with average stoichiometry of $C_{60}(O_2)_{0.35}$. Thus, the photo-excitation promotes the diffusion of oxygen in the $C_{60}$ films by a factor of ~2400 Å/~200 Å=12. Furthermore, the final oxygen stoichiometry was found to be sensitive to the power density of the irradiating light.

Discussed next is the study on the effects of oxygen doping on the vibrational and electronic properties of pristine $C_{60}$. All $C_{60}$ films used in this study were oxygen doped at room temperature and 1 atm. of $O_2$ using the 4880 Å Ar ion laser radiation ($\phi_L$=15 mW/mm$^2$) for 1 to 25 h. This power density is lower than that known to induce significant photopolymerization of pristine $C_{60}$ as described above. In fact, the presence of $O_2$ in $C_{60}$ hardens pristine $C_{60}$ against photo-polymerization. The oxygen stoichiometry after 1 h and 25 h of doping under these conditions was found to be $C_{60}(O_2)_{1.25}$ and $C_{60}(O_2)_{1.5}$, respectively, suggesting that most of the oxygen molecules enter the $C_{60}$ fcc lattice in the initial 1–2 h. The saturated stoichiometry should be $C_{60}(O_2)_2$, if all the octahedral sites are filled.

Figure 6:
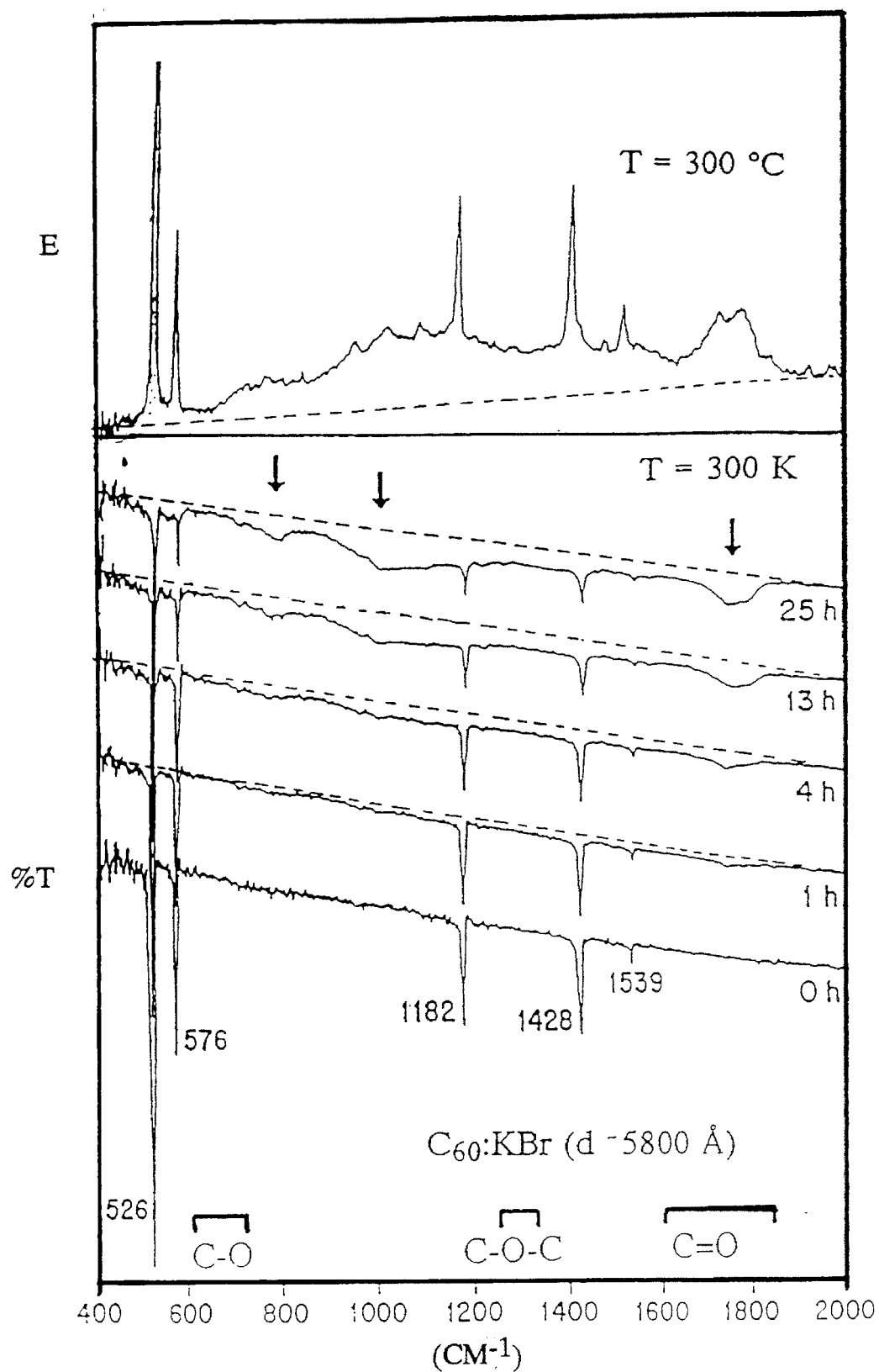
FIG. 6 is IR tansmission spectra. Top panel: Infrared emission spectrum of $C_{60}$ powder involved in a thermal oxidation reaction at T=300° C. Bottom panel: FTIR transmission spectra for $C_{60}$:KBr film after exposure to light (4880 Å, 1.5 $mW/mm^2$) and 1 atm. oxygen for the indicated times.

The lower panel of FIG. 6 shows the time evolution of the T=300° K. IR spectra for increasing exposure to oxygen in the presence of 488 nm light. A $C_{60}$ film (d ~5800 Å) deposited on KBr substrate was simultaneously exposed to 1 atm. dioxygen and light as mentioned above, and the IR spectra were collected at 0, 1, 4, 13 and 25 h intervals. The IR emission spectrum obtained from the thermal oxidation of $C_{60}$ at T=300° C. in the presence of oxygen is adapted from A. M. Vassallo et al. J. Am. Chem. Soc. 113:7820 (1991)] and is shown in the top panel of FIG. 6. The changes in the IR spectra shown in both panel of FIG. 6 were due to the interaction between $C_{60}$ and doped oxygen and the dashed lines in the figure serve as a guide to the eye to allow the observation these changes in the spectra. Photo-induced changes in the IR spectra associated with the polymerization of $C_{60}$ are quite different. The four strong IR ($F_{1u}$) bands observed for the $C_{60}O_{2.5}$ (1 h exposed) were found identical to that of oxygen-free $C_{60}$ (0 h exposed) indicating that even after 1 h exposure, the majority of the $C_{60}$ molecules had not been chemically attacked or oxidized and the coupling between the $C_{60}$ and oxygen molecules was weak, i.e., $O_2$ was physisorbed into the lattice to form a clathrate. However, a hint of a broad IR continuum is evident in the 1 h spectrum indicating that, after 1 h exposure small fraction of the film had been oxidized. The absence of significant changes in the IR at exposure time where stoichiometry is $C_{60}(O_2)_{1.25}$ suggests that no chemical bonds had yet formed between the dioxygen and $C_{60}$. If these bonds were formed, then the $I_h$ symmetry of $C_{60}$ would have been lowered, activating many new IR and Raman-active modes as observed in the IR spectrum of $C_{60}O$ [K. M. Creegan et al. J. Am. Chem. Soc. 114:1103 (1992)]. As mentioned earlier, it is important to note that α-scattering experiments on similar oxygen exposed films indicated a uniform distribution of $O_2$ throughout the film with an average stoichiometry of $C_{60}(O_2)_{1.25}$, i.e., ~1 $O_2$ for every $C_{60}$ molecule. Consistent with the t=1 h IR spectrum, it is concluded that dioxygen initially diffused throughout the bulk as $O_2$, and resided physisorbed in molecular form in the $C_{60}$ lattice. This is also consistent with the intercalation results reported by other researchers.

However, clear evidence for an oxidation of the fcc $C_{60}$ lattice appears at later times, e.g., t~4 h exposure to oxygen and light. As seen in the lower panel of FIG. 6, ~4 h exposure led to the initial formation of a broad band at ~1750 cm$^{-1}$ identified with C═O stretching mode This broad band (~100–150 cm$^{-1}$ in width) grew along with other similar broad features at ~750 and 950 cm$^{-1}$ (indicated by arrows in FIG. 6) with increased simultaneous exposure to $O_2$ and light, as shown in the top two traces taken at t~13 and ~25 h. A single, broad continuum absorption extending from ~400 to 1850 cm$^{-1}$ was observed after 1 h exposure which grew with exposure time while the strength of the intrinsic $F_{1u}$ modes was observed to decrease, indicating a decline in the number of pristine $C_{60}$ molecules. This wide range of frequencies in the IR continuum corresponds to almost the entire range of radial (200<ω<700 cm$^{-1}$) and tangential (900<ω<1600 cm$^{-1}$) $C_{60}$ modes.

Figure 7:
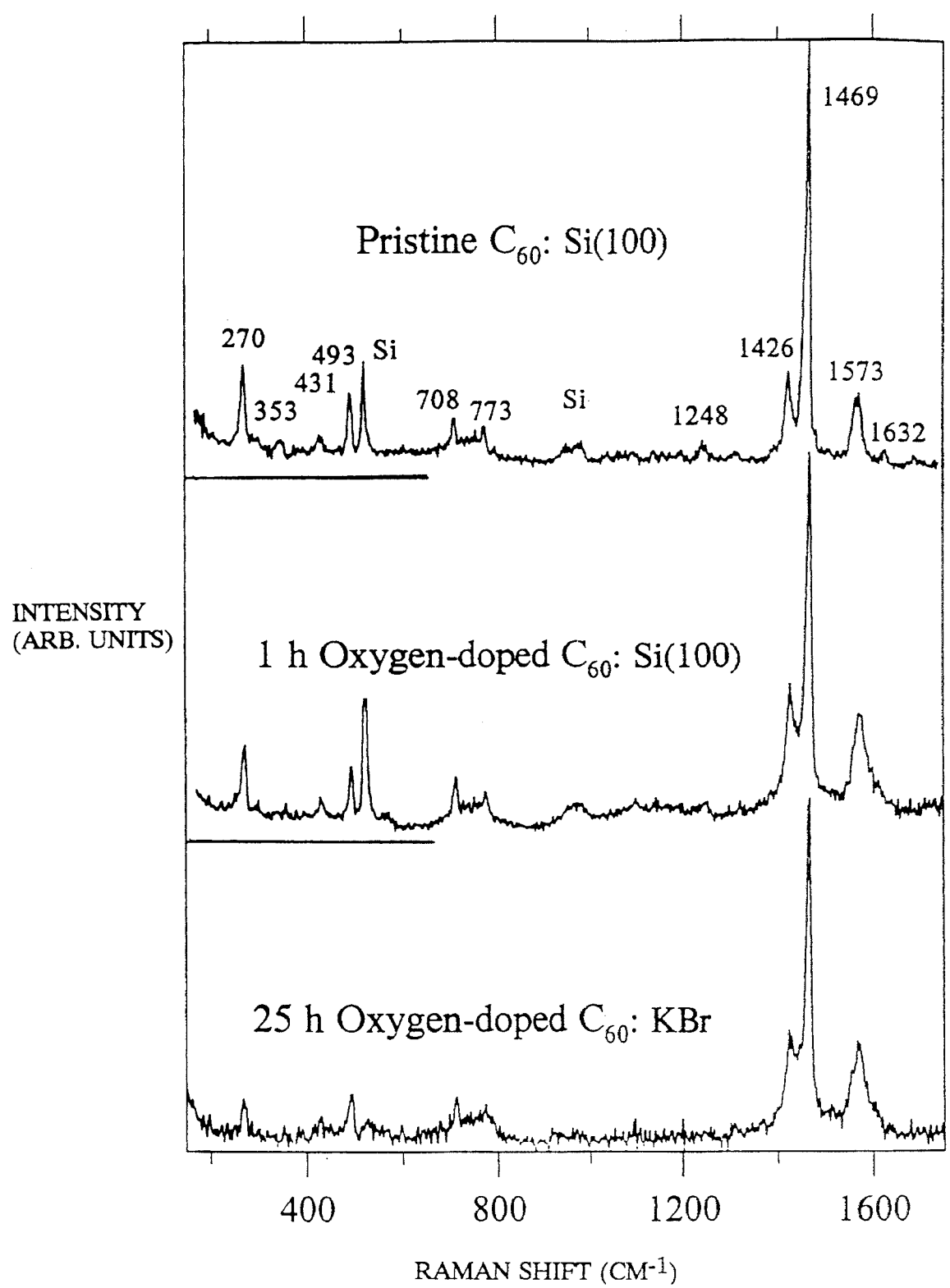
FIG. 7 is Raman spectra for pristine, 1 h oxygen-doped and 25 h oxygen-doped $C_{60}$ films.

The T=300K Raman spectrum for pristine $C_{60}$, 1 h and 25 h photo-assisted oxygen doped $C_{60}$ are shown in FIG. 7, which exhibits ten strong lines indicating that the $C_{60}$ cage was left largely intact even after prolonged exposure to light and di-oxygen. The line broadening in the Raman spectra for the dioxygen doped films is attributed to the presence of oxygen in the fcc $C_{60}$ lattice, consistent with the α-scattering measurements. Note that only small changes in the Raman spectra can be identified with oxygen doping, in apparent contrast to the IR results in FIG. 6. In particular, the bottom spectrum for the 25 h exposed sample did not exhibit a strong vibrational continuum in the range 500–1800 cm$^{-1}$. It is proposed that the spectra of the oxygen doped samples in FIG. 7 emphasize the clathrate phase because this phase exhibits resonant Raman scattering. The regions in the sample which correspond to chemisorbed oxygen, on the other hand, are proposed not to exhibit resonant Raman scattering and their contribution to the spectrum is thereby suppressed. Proceeding with these assumptions, then the broadening observed upon oxygen doping (i.e., the 493, 773, 1426 and 1573 cm$^{-1}$ modes broaden by a factor of ~1.5) is identified with a weak coupling between $C_{60}$ and $O_2$ physisorbed in the octahedral interstices. Finally, if the exposure to oxygen and light were to lead to large scale rupturing of the $C_{60}$ shells, then one would expect to observe broad (50–100 cm$^{-1}$) Raman bands at ~1350 cm$^{-1}$ (disordered carbon) or 1360 and 1580 cm$^{-1}$ (disordered sp$^2$ carbon).

Figure 8:
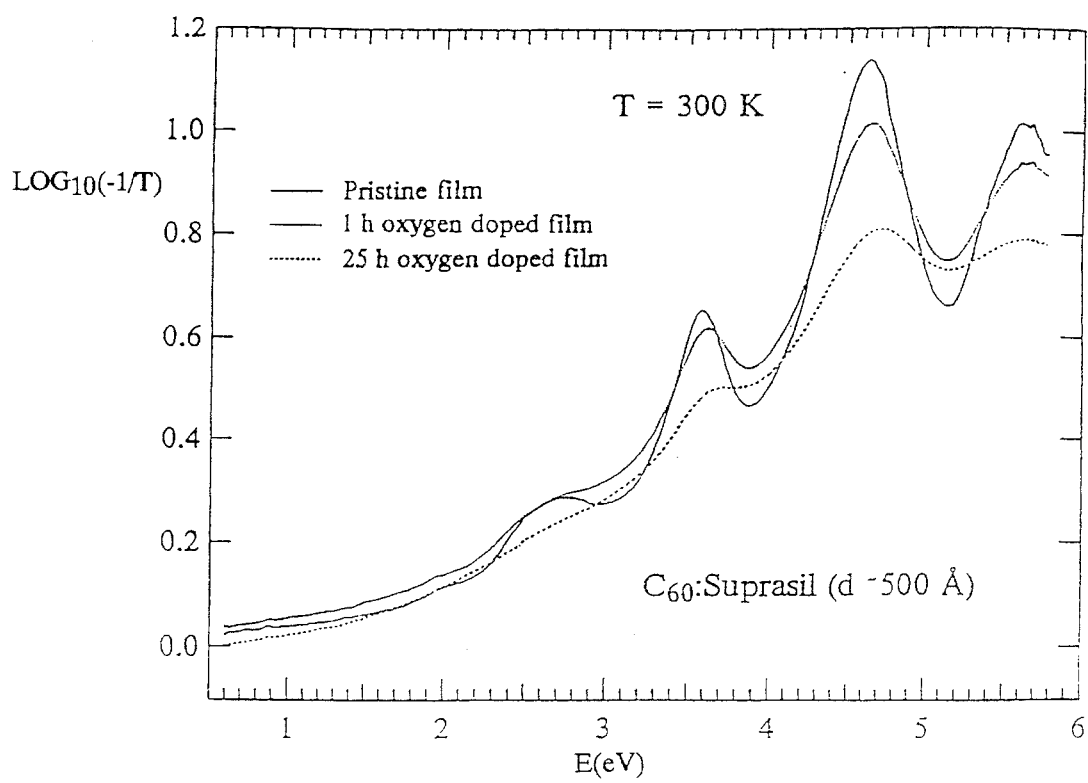
FIG. 8 is electronic absorption spectra for pristine, 1 h oxygen-doped and 25 h oxygen-doped $C_{60}$ films.

FIG. 8 displays the effect of oxygen exposure on the electronic absorption spectrum. The data are plotted as $\log_{10}(1/T)$ vs. photon energy, where T is the sample transmission coefficient. Four narrow (~0.5 eV wide) absorption bands for pristine (0 h exposure) $C_{60}$ were observed in good agreement with the literature and are identified with the dipole-allowed transitions between bonding (π) and antibonding (π*) $C_{60}$ states. Consistent with the conclusions from the vibrational studies discussed above, the optical absorption spectra (FIG. 8) for pristine $C_{60}$ similarly exposed to light and $O_2$ for 1 h showed a noticeable effect on the molecular electronic levels. The slight broadening of these bands after 1 h exposure suggests an increased weak coupling of the $C_{60}$ balls to $O_2$. These peaks were found to further broaden after 25 h of photo-assisted oxygen doping, consistent with electronic perturbation of the $C_{60}$ states. Consistent with FTIR results, this broadening must be identified with oxidation of the $C_{60}$ molecules. Again, it is possible that the broadening of the electronic absorption bands after a prolonged photo-assisted reaction of $O_2$ in the $C_{60}$ films is consistent with the formation of a disordered $C_{60}$-oxide, in which a distribution of species such as $C_{60}O_x$, where x=1, 2, . . . are formed.

OTHER EMBODIMENTS

From the above description, one skilled in the art can easily ascertain the essential characteristics of the present invention, and without departing from the spirit and scope thereof, can make various changes and modifications of the invention to adapt it to various usages and conditions. Thus, other embodiments are also within the claims.

For example, photo-assisted fullerene polymerization can be performed on the surface (i.e., the optical skin depth) of a solid $C_{60}$ cube. As another example, it is also contemplated to conduct phototransformation of this invention by irradiating a saturated fullerene solution (e.g., toluene) with a proper light.

What is claimed is:

1. A composition comprising fullerene molecules in a film, or in a powder having particles of 1–50 micrometers diameter, with gas molecules or gas atoms uniformly dispersed throughout said film or powder particles, wherein said gas molecules or gas atoms are physisorbed to said fullerene molecules.

2. The composition of claim 1, wherein each of said fullerene molecules has the formula $C_n$ where n is 60 or 70.

3. The composition of claim 2, wherein n is 60.

4. The composition of claim 3, wherein each of said gas molecules or atoms is $O_2$.

5. The composition of claim 4, wherein the stoichiometry of $C_{60}$ and $O_2$ is $C_{60}(O_2)_x$ in which x is 0.3–2.

6. The composition of claim 5, wherein x is 0.7–2.

7. The composition of claim 5, wherein x is 0.3–1.

8. The composition of claim 5, wherein said fullerene molecules are in a film.

9. The composition of claim 6, wherein said fullerene molecules are in a film.

10. The composition of claim 7, wherein said fullerene molecules are in a film.

\* \* \* \* \*